US012574049B2

(12) United States Patent
Yamagami

(10) Patent No.: US 12,574,049 B2
(45) Date of Patent: Mar. 10, 2026

(54) AUDIO D/A CONVERTER

(71) Applicant: ROHM CO., LTD., Kyoto (JP)

(72) Inventor: Shinji Yamagami, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 85 days.

(21) Appl. No.: 18/606,487

(22) Filed: Mar. 15, 2024

(65) Prior Publication Data

US 2024/0313802 A1 Sep. 19, 2024

(30) Foreign Application Priority Data

Mar. 16, 2023 (JP) ................................. 2023-042330

(51) Int. Cl.
*H03M 3/00* (2006.01)
*H04R 5/04* (2006.01)

(52) U.S. Cl.
CPC ................ *H03M 3/50* (2013.01); *H04R 5/04* (2013.01); *H03M 3/418* (2013.01); *H03M 3/436* (2013.01)

(58) Field of Classification Search
CPC ........ H03M 3/50; H03M 3/418; H03M 3/436; H04R 5/04
See application file for complete search history.

(56) References Cited

U.S. PATENT DOCUMENTS

2020/0083900 A1* 3/2020 Shabra .................. H03M 3/418

\* cited by examiner

*Primary Examiner* — Joseph J Lauture
(74) *Attorney, Agent, or Firm* — CANTOR COLBURN LLP

(57) ABSTRACT

An audio D/A converter includes: a first segment D/A converter including N elements; a second segment D/A converter including N elements; a first oversampling filter configured to process a PCM signal; a second oversampling filter configured to process a PCM signal; a first multilevel $\Delta\Sigma$ modulator configured to process an output of the first oversampling filter; a second multilevel $\Delta\Sigma$ modulator configured to process an output of the second oversampling filter; a first switching controller configured to control the first segment D/A converter according to an input to the first switching controller; and a second switching controller configured to control the second segment D/A converter according to an input to the second switching controller.

3 Claims, 6 Drawing Sheets

FIG. 2

Stereo Mode

FIG. 4
(Related Art)

Mono Mode

AUDIO D/A CONVERTER

CROSS-REFERENCE TO RELATED APPLICATIONS

The present invention claims priority under 35 U.S.C. § 119 to Japanese Patent Application No. 2023-042330, filed on Mar. 16, 2023, the entire content of which is incorporated herein by reference.

TECHNICAL FIELD

The present disclosure relates to audio signal processing.

BACKGROUND

An audio D/A converter may include multiple channels formed on one chip. Such an audio D/A converter may be used in a mono mode in which audio signals of the same channel are input to multiple channels and analog outputs of the multiple channels are synthesized.

BRIEF DESCRIPTION OF DRAWINGS

The accompanying drawings, which are incorporated in and constitute a part of the present disclosure, illustrate embodiments of the present disclosure.

FIG. 2 is a diagram showing the audio D/A converter operating in a stereo mode.

FIG. 4 is a diagram illustrating a mono mode of an audio D/A converter according to a comparative technique.

DETAILED DESCRIPTION

Summary of Embodiments

Figure 1:
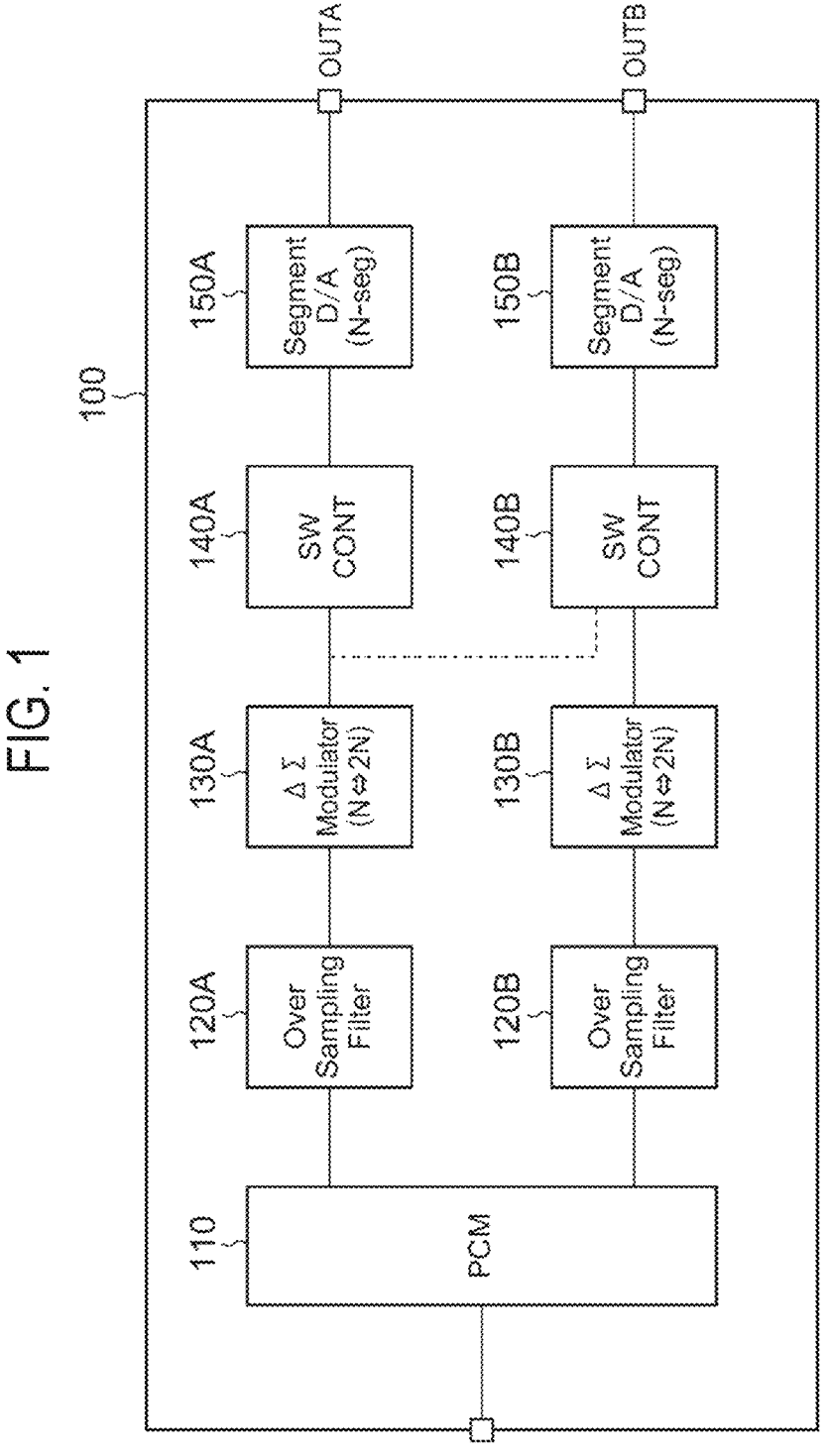
FIG. 1 is a block diagram of an audio D/A converter according to an embodiment of the present disclosure.

A summary of some exemplary embodiments of the present disclosure will be described. This summary is intended to provide a simplified description of some concepts of one or more embodiments in order to provide a basic understanding of the embodiments as a prelude to the following detailed description and is not intended to limit the scope of the present disclosure. This summary is not a comprehensive overview of all conceivable embodiments and is not intended to identify significant elements of all embodiments or to delineate the scope of some or all embodiments. For the sake of convenience, "an embodiment" may be used to refer to one embodiment (example or modification) or multiple embodiments (examples or modifications) disclosed in the present disclosure.

An audio D/A converter according to an embodiment of the present disclosure includes a first segment D/A converter including N elements (N≥2), a second segment D/A converter including N elements, a first oversampling filter configured to process a PCM signal, a second oversampling filter configured to process a PCM signal, a first multilevel ΔΣ modulator configured to process an output of the first oversampling filter, a second multilevel ΔΣ modulator configured to process an output of the second oversampling filter, a first switching controller configured to control the first segment D/A converter according to an input to the first switching controller, and a second switching controller configured to control the second segment D/A converter according to an input to the second switching controller. The audio D/A converter is switchable between a stereo mode and a mono mode. (1) In the stereo mode, PCM signals of different channels are input to the first oversampling filter and the second oversampling filter, the number of gradations of outputs of the first multilevel ΔΣ modulator and the second multilevel ΔΣ modulator is N, an output of the first multilevel ΔΣ modulator is supplied to the first switching controller, and an output of the second multilevel ΔΣ modulator is supplied to the second switching controller. (2) In the mono mode, PCM signals of the same channel are input to the first oversampling filter, the number of gradations of the output of the first multilevel ΔΣ modulator is 2×N, and the output of the first multilevel ΔΣ modulator is distributed and supplied to the first switching controller and the second switching controller.

According to this configuration, in the mono mode, the output of the first multilevel ΔΣ modulator has 2×N gradations. By distributing the output of the 2×N gradations to the first segment D/A converter including N elements and the second segment D/A converter including N elements, an analog output of the first segment D/A converter and an analog output of the second segment D/A converter are independently changed in N gradations. Therefore, a composite signal of the two analog outputs has 2×N gradations. This makes it possible to fully use of the hardware and improve sound quality as compared to the mono mode in the related art.

In some embodiments, the audio D/A converter may be switchable between a first mode and a second mode. The audio D/A converter may further include a timing synchronization circuit which is enabled in the first mode and capable of outputting a timing synchronization signal to another audio D/A converter operating in the second mode. The audio D/A converter may be configured to operate in the second mode in synchronization with the timing synchronization signal supplied from another audio D/A converter operating in the first mode. According to this configuration, two audio D/A converters may be operated in synchronization.

In some embodiments, the audio D/A converter may be monolithically integrated on one semiconductor substrate. The expression "monolithically integrated" includes a case where all components of a circuit are formed on the semiconductor substrate, and a case where main components of a circuit are monolithically integrated, and some of resistors, capacitors, and the like may be provided outside the semiconductor substrate so as to adjust circuit constants. By integrating a circuit on one chip, a circuit area can be reduced, and characteristics of circuit elements can be kept uniform.

Embodiments

Hereinafter, preferred embodiments will be described with reference to the drawings. Identical or equivalent components, members, and processes shown in each drawing are designated by like reference numerals, and redundant explanations thereof will be omitted as appropriate. Further, the embodiments are exemplary rather than limiting the present disclosure. All features and combinations thereof described in the embodiments are not necessarily essential to the present disclosure.

In the present disclosure, "a state where a member A is connected to a member B" includes a case where the member A and the member B are physically and directly connected or even a case where the member A and the member B are indirectly connected through any other member that does not substantially affect an electrical connection state between the members A and B or does not impair functions and effects achieved by combinations of the members A and B.

Similarly, "a state where a member C is connected (installed) between a member A and a member B" includes a case where the member A and the member C or the member B and the member C are indirectly connected through any other member that does not substantially affect an electrical connection state between the members A and C or the members B and C or does not impair functions and effects achieved by combinations of the members A and C or the members B and C, in addition to a case where the member A and the member C or the member B and the member C are directly connected.

Embodiment

FIG. 1 is a block diagram of an audio D/A converter 100 according to an embodiment of the present disclosure. The audio D/A converter 100 (hereinafter also simply referred to as a D/A converter) is a DAC chip integrated on one semiconductor substrate.

The audio D/A converter 100 is configured with two channels. The audio D/A converter 100 is switchable between a stereo mode and a mono mode. In the stereo mode, the audio D/A converter 100 converts PCM signals of two channels into analog signals of two channels. In the mono mode, the audio D/A converter 100 converts a PCM signal of one channel into an analog signal of one channel by using hardware resources of the two channels.

The audio D/A converter 100 includes an interface circuit 110, a first oversampling filter 120A, a second oversampling filter 120B, a first multilevel $\Delta\Sigma$ modulator 130A, a second multilevel $\Delta\Sigma$ modulator 130B, a first switching controller 140A, a second switching controller 140B, a first segment D/A converter 150A, and a second segment D/A converter 150B. Subscripts A and B indicate channels.

The interface circuit 110 is configured to receive a PCM signal from an external sound source (not shown).

The first segment D/A converter 150A and the second segment D/A converter 150B respectively include N elements.

The first oversampling filter 120A performs an oversampling process on the input PCM signal. The second oversampling filter 120B performs an oversampling process on the input PCM signal.

The first multilevel $\Delta\Sigma$ modulator 130A is configured to process an output of the first oversampling filter 120A. The second multilevel $\Delta\Sigma$ modulator 130B is configured to process an output of the second oversampling filter 120B. Each of the first multilevel $\Delta\Sigma$ modulator 130A and the second multilevel $\Delta\Sigma$ modulator 130B includes a quantizer provided at an output stage and is configured such that the number of gradations of the quantizer is switchable between two states, i.e., an N level and a 2×N level, depending on an operating mode (the stereo mode or the mono mode) of the audio D/A converter 100.

The first switching controller 140A controls the first segment D/A converter 150A according to an input to the first switching controller 140A. The second switching controller 140B controls the second segment D/A converter 150B according to an input to the second switching controller 140B. The first switching controller 140A and the second switching controller 140B may utilize techniques such as a dynamic element matching (DEM) and data weighted average (DWA). The second switching controller 140B may be supplied with an output of the first multilevel $\Delta\Sigma$ modulator 130A or an output of the second multilevel $\Delta\Sigma$ modulator 130B, depending on the operating mode.

The stereo mode and the mono mode will be described below.

(1) Stereo Mode

Figure 2:
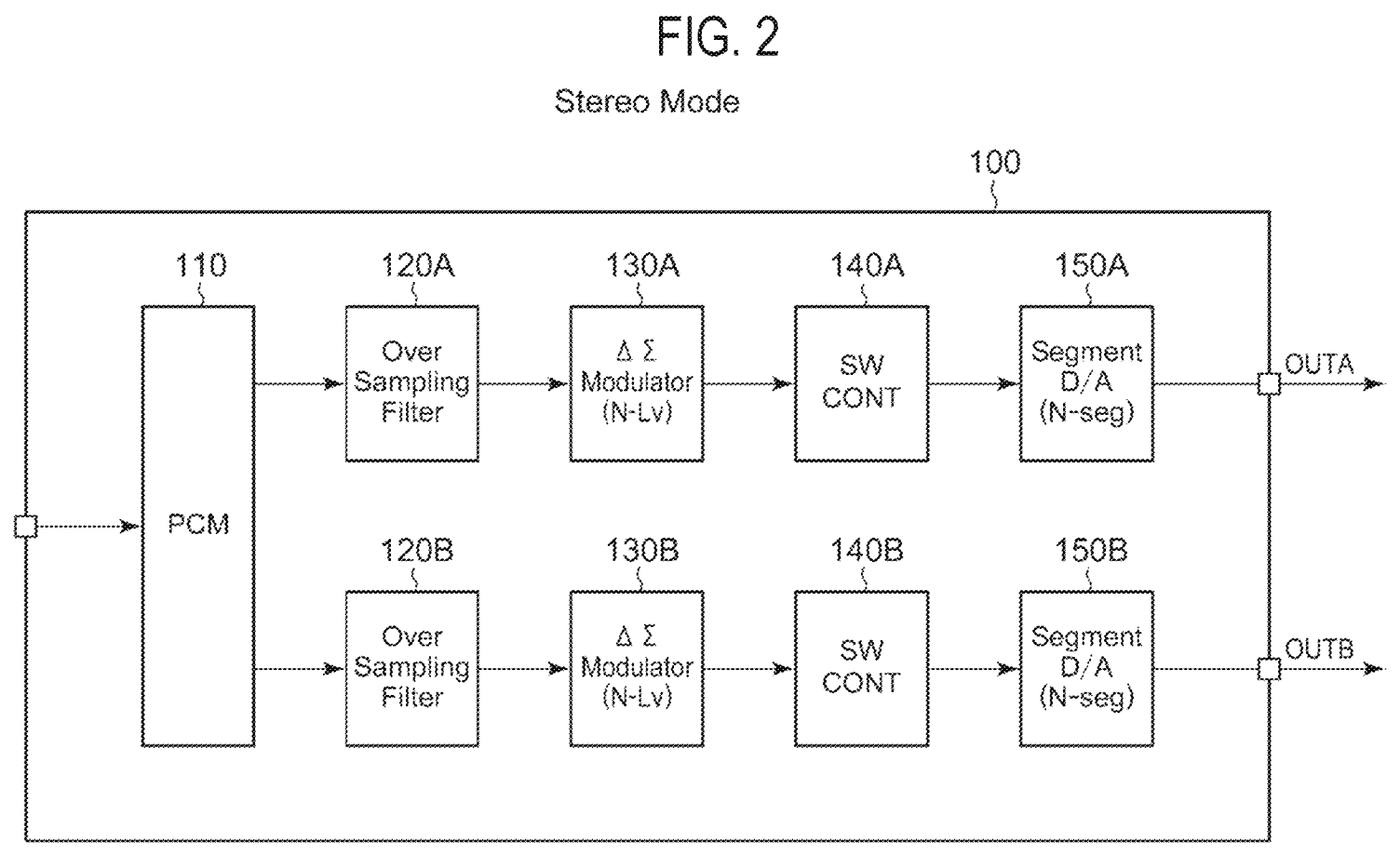

FIG. 2 is a diagram showing the audio D/A converter 100 operating in the stereo mode. PCM signals of different channels are input to the first oversampling filter 120A and the second oversampling filter 120B. The number of gradations of the outputs of the first multilevel $\Delta\Sigma$ modulator 130A and the second multilevel $\Delta\Sigma$ modulator 130B is N. The output of the first multilevel $\Delta\Sigma$ modulator 130A is supplied to the first switching controller 140A, and the output of the second multilevel $\Delta\Sigma$ modulator 130B is supplied to the second switching controller 140B.

(2) Mono Mode

Figure 3:
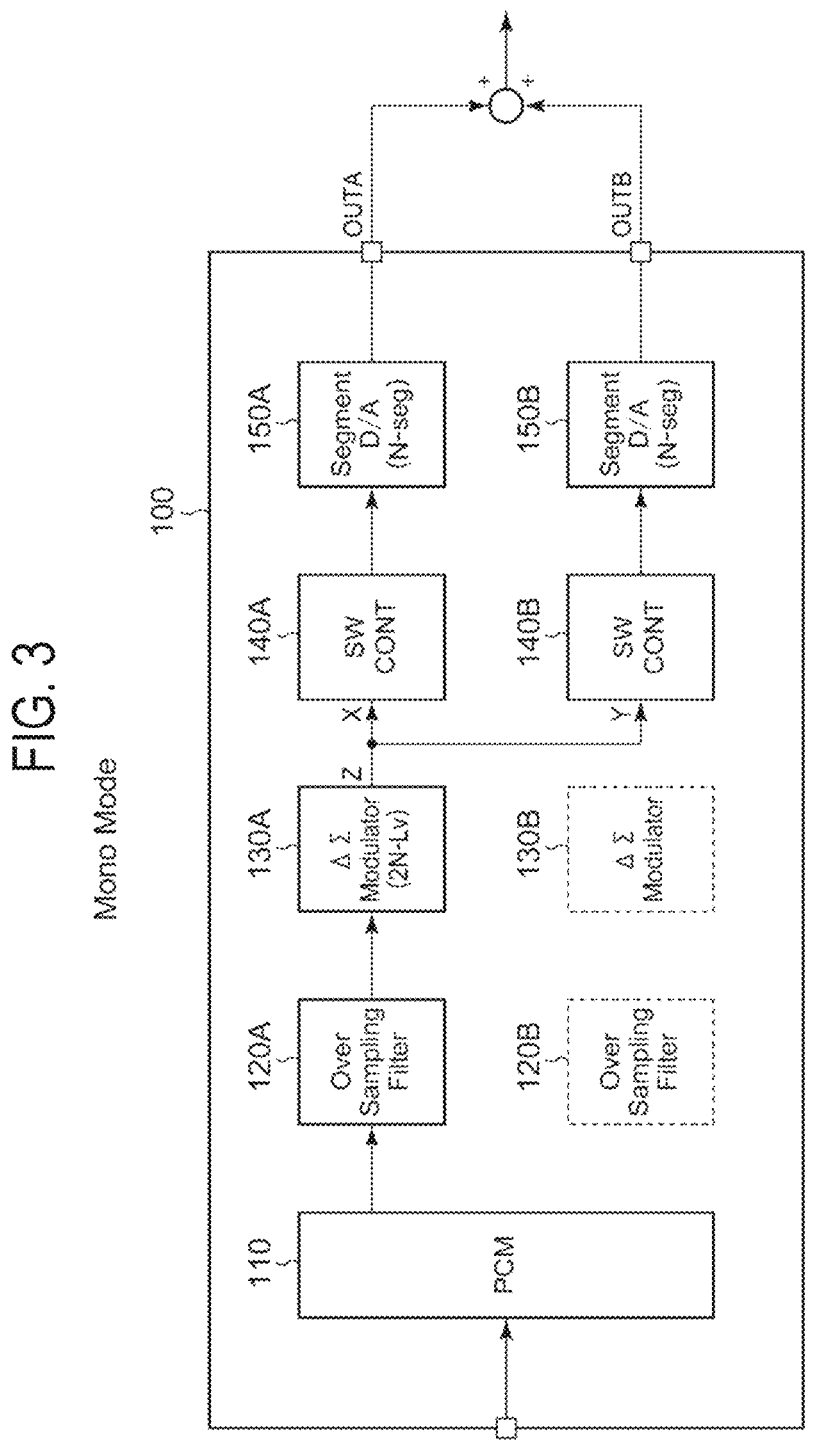
FIG. 3 is a diagram showing the audio D/A converter operating in a mono mode.

FIG. 3 is a diagram showing the audio D/A converter 100 operating in the mono mode. PCM signals of the same channel (channel A) are inputted to the first oversampling filter 120A.

In the mono mode, 2×N is selected as the number of gradations of the output of the first multilevel $\Delta\Sigma$ modulator 130A. Then, the output of the first multilevel $\Delta\Sigma$ modulator 130A is distributed and supplied to the first switching controller 140A and the second switching controller 140B. Specifically, the output of the first multilevel $\Delta\Sigma$ modulator 130A is distributed and supplied so as to satisfy Z=X+Y when a value of the output of the first multilevel $\Delta\Sigma$ modulator 130A is Z, a value of the input of the first switching controller 140A is X, and a value of the input of the second switching controller 140B is Y. In this case, X≤N and Y≤N.

The output of the first segment D/A converter 150A and the output of the second segment D/A converter 150B are added to generate an analog output of the channel A.

The above is the configuration of the audio D/A converter 100. Advantages of this audio D/A converter 100 become apparent when compared with a comparative technique.

Figure 4:
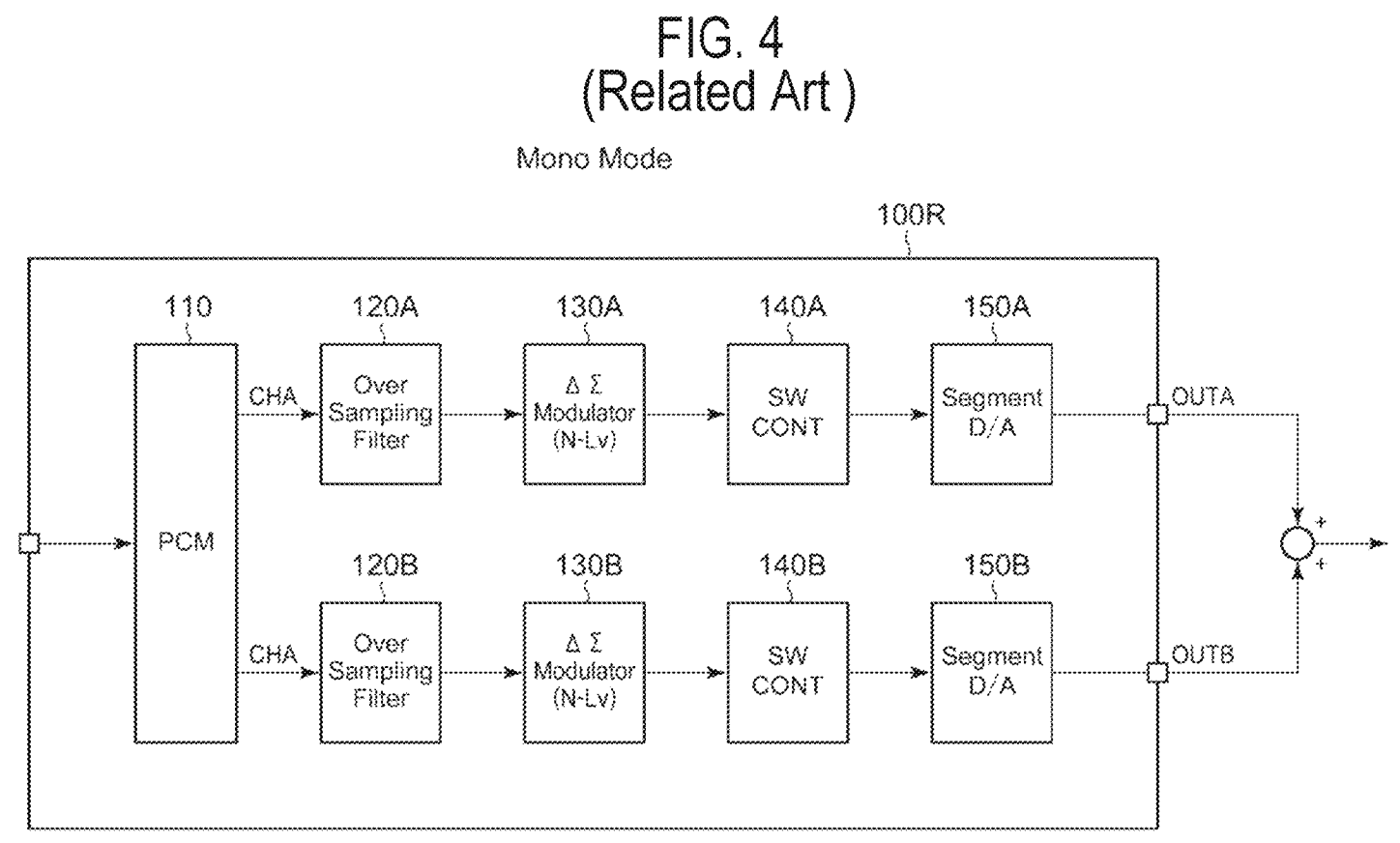

FIG. 4 is a diagram illustrating a mono mode of an audio D/A converter 100R according to a comparative technique. In the comparative technique, the number of gradations of outputs of the first multilevel $\Delta\Sigma$ modulator 130A and the second multilevel $\Delta\Sigma$ modulator 130B is N, which is equal to the number of segments of the first segment D/A converter 150A and the second segment D/A converter 150B.

Figure 5:
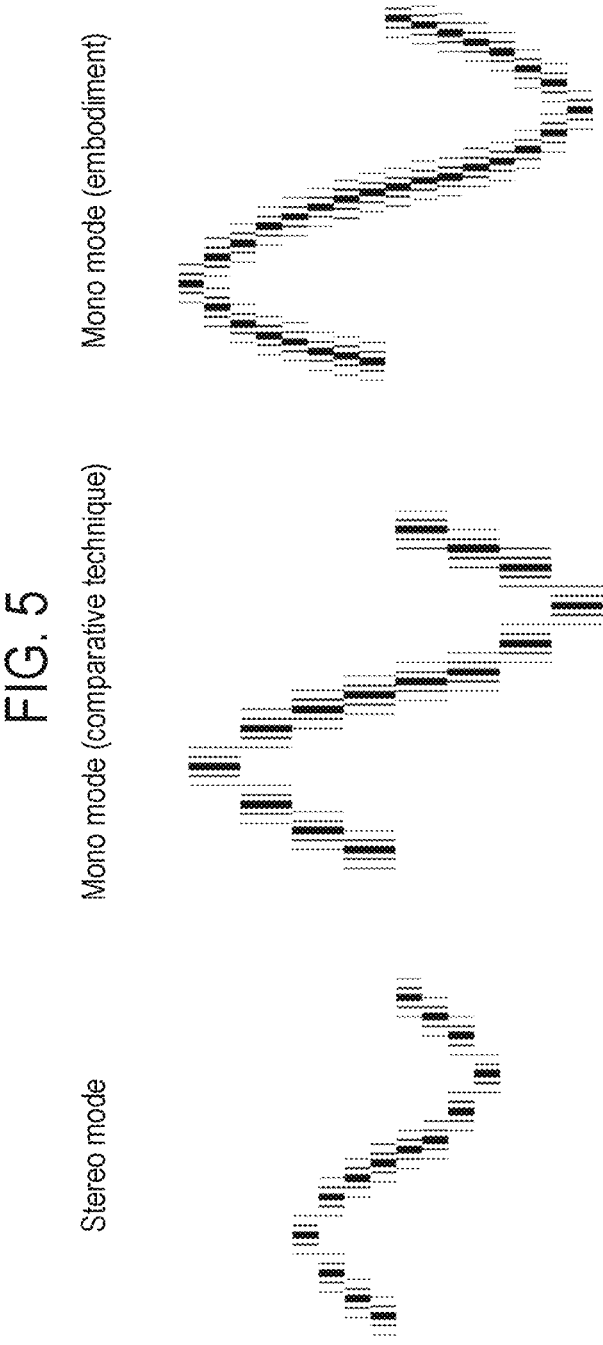
FIG. 5 is a diagram schematically showing analog outputs in a stereo mode, a mono mode according to the comparative technique, and a mono mode according to an embodiment of the present disclosure.

FIG. 5 is a diagram schematically showing analog outputs in the stereo mode, the mono mode according to the comparative technique, and the mono mode according to the embodiment.

Here, it is assumed that N is 8. In the stereo mode, the analog output is changed in eight gradations. In the mono mode according to the comparative technique, the analog signal obtained in the stereo mode is amplified twice, and an S/N ratio is thereby improved. However, the number of gradations remains N=8. In other words, in the mono mode of the comparative technique, even though the D/A converter at the output stage of the audio D/A converter 100R has 16 segments, the analog output remains at 8 gradations and thus, it cannot be said that the hardware can be fully utilized.

On the other hand, in the mono mode according to the embodiment, an amplitude is doubled and the number of gradations is also 2×N. In other words, the 16 segments can be fully utilized, which provides an advantage in that the sound quality can be improved as compared with the comparative technique.

Figure 6:
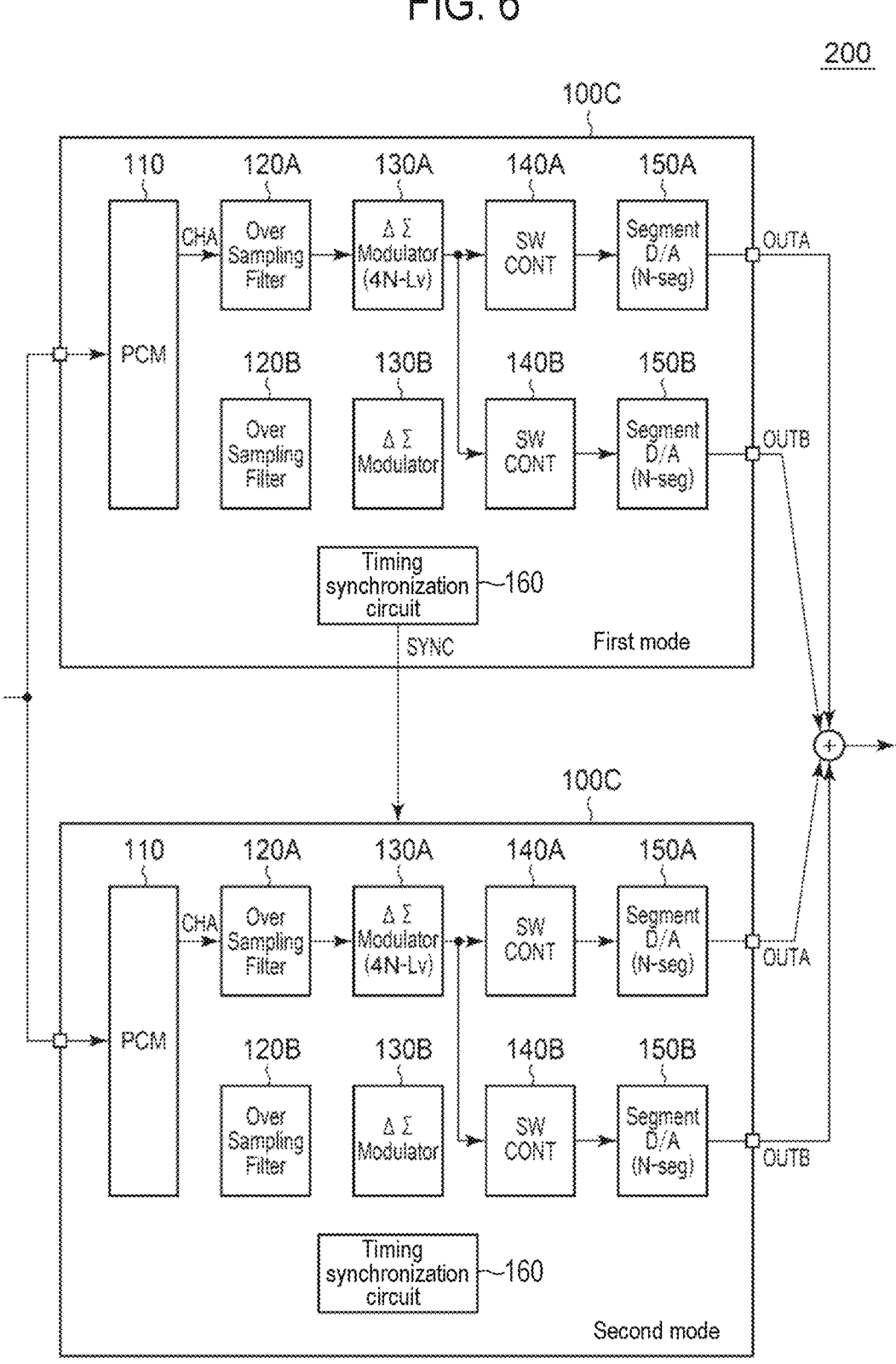
FIG. 6 is a diagram showing a DAC system using an audio D/A converter according to a modification.

FIG. 6 is a diagram showing a DAC system 200 in which an audio D/A converter 100C according to a modification is used. The DAC system 200 includes two audio D/A converters 100C. The audio D/A converter 100C includes a timing synchronization circuit 160 in addition to the audio D/A converter 100 according to the embodiment.

The audio D/A converter 100C is switchable between a first mode (controller mode or upper mode) and a second mode (target mode or lower mode). In FIG. 6, an upper audio D/A converter 100C is in the first mode, and a lower audio D/A converter 100C is in the second mode. The timing synchronization circuit 160 is enabled in the first mode and is capable of outputting a timing synchronization signal SYNC to another audio D/A converter 100C operating in the second mode.

The audio D/A converter 100C in the second mode operates in synchronization with the timing synchronization signal SYNC supplied from another audio D/A converter 100 in the first mode.

Each of the audio D/A converters 100C in the first mode and the second mode operates in the mono mode and converts the PCM signal of the same channel CHA into an analog signal. In the configuration of FIG. 6, 4×N is selected as the number of gradations of the output of the first multilevel ΔΣ modulator 130A. The outputs of the two audio D/A converters 100C are added to generate an analog signal.

The above is a configuration of the audio D/A converter 100.

According to the DAC system 200 of FIG. 6, it is possible to obtain an analog signal in which the mono mode waveform according to the embodiment of FIG. 5 is amplified two times. This makes it possible to further improve the S/N ratio.

Although the embodiments according to the present disclosure have been described by using specific terms, this description is nothing more than an example presented to aid understanding and is not intended to limit the scope of the present disclosure or the claims. The scope of the present disclosure is defined by the claims. Therefore, embodiments, examples, and modifications not described herein are also included in the scope of the present disclosure.

(Supplementary Note)

The following technique is disclosed in the present disclosure.

(Item 1)

An audio D/A converter for processing a PCM signal, includes:

a first segment D/A converter including N elements;
  a second segment D/A converter including N elements;
  a first oversampling filter configured to process the PCM signal;
  a second oversampling filter configured to process the PCM signal;
  a first multilevel ΔΣ modulator configured to process an output of the first oversampling filter;
  a second multilevel ΔΣ modulator configured to process an output of the second oversampling filter;

a first switching controller configured to control the first segment D/A converter according to an input to the first switching controller; and
  a second switching controller configured to control the second segment D/A converter according to an input to the second switching controller,
  wherein the audio D/A converter is switchable between a stereo mode and a mono mode,
  wherein in the stereo mode, the PCM signal is distributed to be inputted to the first oversampling filter and the second oversampling filter, the number of gradations of outputs of the first multilevel ΔΣ modulator and the second multilevel ΔΣ modulator is N, the output of the first multilevel ΔΣ modulator is supplied to the first switching controller, and the output of the second multilevel ΔΣ modulator is supplied to the second switching controller, and
  wherein in the mono mode, the PCM signal is input to the first oversampling filter, the number of gradations of the output of the first multilevel ΔΣ modulator is 2×N, and the output of the first multilevel ΔΣ modulator is distributed and supplied to the first switching controller and the second switching controller.

(Item 2)

The audio D/A converter of Item 1, wherein the audio D/A converter is switchable between a first mode and a second mode, wherein the audio D/A converter further comprises: a timing synchronization circuit which is enabled in the first mode and capable of outputting a timing synchronization signal to another audio D/A converter operating in the second mode, and
  wherein the audio D/A converter is configured to operate in the second mode in synchronization with the timing synchronization signal supplied from another audio D/A converter operating in the first mode.

(Item 3)

The audio D/A converter of Item 1 or 2, which is monolithically integrated on one semiconductor substrate.

While certain embodiments have been described, these embodiments have been presented by way of example only and are not intended to limit the scope of the disclosures. Indeed, the embodiments described herein may be embodied in a variety of other forms. Furthermore, various omissions, substitutions, and changes in the form of the embodiments described herein may be made without departing from the spirit of the disclosures. The accompanying claims and their equivalents are intended to cover such forms or modifications as would fall within the scope and spirit of the disclosures.

What is claimed is:

1. An audio D/A converter for processing a PCM signal, comprising:

a first segment D/A converter including N elements;
  a second segment D/A converter including N elements;
  a first oversampling filter configured to process the PCM signal;
  a second oversampling filter configured to process the PCM signal;
  a first multilevel ΔΣ modulator configured to process an output of the first oversampling filter;
  a second multilevel ΔΣ modulator configured to process an output of the second oversampling filter;
  a first switching controller configured to control the first segment D/A converter according to an input to the first switching controller; and

7 a second switching controller configured to control the second segment D/A converter according to an input to the second switching controller, wherein the audio D/A converter is switchable between a stereo mode and a mono mode, wherein in the stereo mode, the PCM signal is distributed to be input to the first oversampling filter and the second oversampling filter, the number of gradations of outputs of the first multilevel $\Delta\Sigma$ modulator and the second multilevel $\Delta\Sigma$ modulator is N, the output of the first multilevel $\Delta\Sigma$ modulator is supplied to the first switching controller, and the output of the second multilevel $\Delta\Sigma$ modulator is supplied to the second switching controller, and wherein in the mono mode, the PCM signal is input to the first oversampling filter, the number of gradations of the output of the first multilevel $\Delta\Sigma$ modulator is 2×N, and the output of the first multilevel $\Delta\Sigma$ modulator is

8 distributed and supplied to the first switching controller and the second switching controller.

2. The audio D/A converter of claim 1, wherein the audio D/A converter is switchable between a first mode and a second mode, wherein the audio D/A converter further comprises a timing synchronization circuit which is enabled in the first mode and capable of outputting a timing synchronization signal to another audio D/A converter operating in the second mode, and wherein the audio D/A converter is configured to operate in the second mode in synchronization with the timing synchronization signal supplied from another audio D/A converter operating in the first mode.

3. The audio D/A converter of claim 1, which is monolithically integrated on one semiconductor substrate.

* * * * *